(12) United States Patent
Yang et al.

(10) Patent No.: US 8,633,393 B2
(45) Date of Patent: Jan. 21, 2014

(54) PRINTED CIRCUIT BOARD, MANUFACTURING METHOD THEREOF AND RADIO-FREQUENCY DEVICE

(75) Inventors: Ruiquan Yang, Shenzhen (CN); Haiqiang Sheng, Shenzhen (CN); Hongcai Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 184 days.

(21) Appl. No.: 12/789,247

(22) Filed: May 27, 2010

(65) Prior Publication Data

US 2010/0238635 A1 Sep. 23, 2010

Related U.S. Application Data

(63) Continuation of application No. PCT/CN2008/073417, filed on Dec. 10, 2008.

(30) Foreign Application Priority Data

Dec. 14, 2007 (CN) .......................... 2007 1 0032455

(51) Int. Cl.
*H05K 1/00* (2006.01)
(52) U.S. Cl.
USPC ............ 174/252; 361/748; 361/751; 361/525
(58) Field of Classification Search
USPC ..................... 361/748, 751, 525; 174/252
See application file for complete search history.

(56) References Cited

U.S. PATENT DOCUMENTS

| 4,509,096 A | * | 4/1985 | Baldwin et al. | 361/719 |
| 4,860,165 A | * | 8/1989 | Cassinelli | 361/710 |
| 5,459,639 A | * | 10/1995 | Izumi | 361/707 |

(Continued)

FOREIGN PATENT DOCUMENTS

| CN | 1258190 A | 6/2000 |
| CN | 1428829 A | 7/2003 |

(Continued)

OTHER PUBLICATIONS

Extended European Search Report in corresponding European Application No. 08870655.1 (Feb. 22, 2011).

(Continued)

*Primary Examiner* — Tuan T Dinh
*Assistant Examiner* — Steven Sawyer
(74) *Attorney, Agent, or Firm* — Leydig, Voit & Mayer, Ltd.

(57) ABSTRACT

A printed circuit board (PCB) is provided. The PCB includes a first microwave board material, a second prepreg, and a third ordinary board material that are pressed together. The first microwave board material, the second prepreg, and the third ordinary board material are provided with an opening respectively. At least two openings have different sizes. In a region between boundaries of the at least two openings having different sizes, a borehole is provided to pass through the board material in the region. A back-drilled hole is selectively used. A radio-frequency device and a method for manufacturing a PCB are further provided. Thus, it is suitable for designing different power modules and other circuit modules on the same single board, and is compatible with the existing basic PCB manufacturing technologies, which further has a low cost, and can meet the requirements of large-power radio-frequency circuits with different frequencies.

12 Claims, 4 Drawing Sheets

(56) References Cited

U.S. PATENT DOCUMENTS

| | | | |
|---|---|---|---|
| 6,090,468 | A | 7/2000 | Shimada et al. |
| 6,188,579 | B1 | 2/2001 | Buondelmonte et al. |
| 6,393,696 | B1 | 5/2002 | Yoon et al. |
| 7,741,566 | B2 * | 6/2010 | Johnson ................ 174/262 |
| 2002/0006035 | A1 | 1/2002 | Shimizu et al. |
| 2003/0100197 | A1 | 5/2003 | Veitschegger et al. |
| 2004/0212964 | A1 | 10/2004 | Belady et al. |
| 2006/0092079 | A1 * | 5/2006 | de Rochemont ....... 343/700 MS |
| 2007/0159380 | A1 | 7/2007 | Nagaishi et al. |
| 2008/0136732 | A1 | 6/2008 | O'Connell et al. |
| 2009/0045889 | A1 * | 2/2009 | Goergen et al. .............. 333/175 |

FOREIGN PATENT DOCUMENTS

| | | |
|---|---|---|
| CN | 1659939 A | 8/2005 |
| CN | 100388092 C | 9/2006 |
| CN | 1852633 A | 10/2006 |
| CN | 101460018 B | 2/2011 |
| EP | 2227076 A1 | 9/2010 |
| FR | 2630261 A1 | 10/1989 |
| JP | 2-219298 A | 8/1990 |
| JP | 7-99391 A | 4/1995 |
| JP | 8-116176 A | 5/1996 |
| WO | WO 00/69236 A1 | 11/2000 |

OTHER PUBLICATIONS

Written Opinion of the International Searching Authority in corresponding PCT Application No. PCT/CN2008/073417 (Mar. 19, 2009).

State Intellectual Property Office of the People's Republic of China, International Search Report in International Patent Application No. PCT/CN2008/073417 (Mar. 19, 2009).

* cited by examiner

PRINTED CIRCUIT BOARD, MANUFACTURING METHOD THEREOF AND RADIO-FREQUENCY DEVICE

CROSS-REFERENCE TO RELATED APPLICATIONS

This application is a continuation of International Application No. PCT/CN2008/073417, filed on Dec. 10, 2008, which claims priority to Chinese Patent Application No. 200710032455.1 filed on Dec. 14, 2007, both of which are hereby incorporated by reference in their entireties.

FIELD OF THE TECHNOLOGY

The present invention relates to the field of a printed circuit board (PCB), and more particularly to a PCB, a manufacturing method thereof, and a radio-frequency device.

BACKGROUND OF THE INVENTION

A radio-frequency module of an existing radio-frequency device, for example, a base station (BS), is generally formed by a plurality of single boards, such as transceiver (TRX) single board, low noise amplifier (LNA) single board, power amplifier (PA) single board, power supply single board, and cavity duplexer. Such a radio-frequency module formed by a plurality of single boards is disadvantageous in competition in terms of realizing miniaturization, low cost, high reliability, and easy assembling and maintenance.

At present, the solutions of designing two or more single boards in the radio-frequency module on the same board have also emerged, for example, designing a TRX and an LNA on the same single board, designing a PA and a power supply module on the same single board, or even designing a low-power PA (for example, lower than 60 W), a TRX, an LNA, and a power supply module on the same single board. The implementation of such solutions may improve the competitiveness of the radio-frequency device.

For example, the following single board sharing and laminating design solutions exist in the prior art.

(1) Laminating Design with at Least Two Single Boards

In such a solution, a PA is designed as an independent single board, or the PA and a power supply module are designed on the same single board, and the other modules (for example, a TRX module and an LNA module) are designed on the same single board or separate single boards.

Such a solution can easily meet the ground loop and heat dissipation requirements for the PA. As the area of the PA is not large, the single board of the PA may be made of a radio-frequency board material or formed by pressing the radio-frequency board material with an ordinary board material, and single boards of the other modules may be completely made of an ordinary board material, so that the total cost of a PCB can be effectively controlled. In addition, since at least two single boards are adopted in the solution, a total area of the single boards is enlarged, so that more designing resources for the layout and wiring are provided for the PCB design, and the flexibility of the design solution is improved. However, during the process of implementing the present invention, the inventors found that, in such a solution of the prior art, as radio-frequency signals and power supply and control signals between the single boards are realized through connectors, cable connection, or blind-mate connection, the material cost and assembling cost are increased, and the risk of poor reliability is increased.

(2) Single Board Sharing Design of Low-Power PA

Currently, as for the solution of a single board sharing design between a low-power PA and the other modules, mainly a 1+n+1 laminating solution by using a low-cost board material and a high density interconnection (HDI) technology is usually adopted. In some radio-frequency devices, an LNA and a duplexer are disposed externally, and a PA, a power supply module, and a TRX are integrated on the same single board. In this case, a power amplification tube of the PA is partially sintered or mounted by using screws. Such a solution is applicable to low-frequency low-power PAs. Non-ground holes thereof are just opened to the last but one layer, which is favorable for shielding and heat dissipation. Meanwhile, the structure is simple and the cost is low. The HDI board facilitates the realization of outlet in a few layers of a high-density ball grid array (BGA), and the material cost is low. In addition, if the power amplification tube is mounted by using screws, the assembling process is quite simple.

However, during the process of implementing the present invention, the inventors found that, in such a solution of the prior art, as the signal loss of the low-cost board material is far higher than that of the radio-frequency board material, such a solution is not applicable to high-frequency high-power situations. In addition, as the HDI technology is adopted, the PCB manufacturing cost is higher than that in the plated through hole (PTH) technology. Moreover, the HDI technology cannot be implemented by pressing radio-frequency board materials. As only holes with a limited depth (for example, less than 5 mil) can be formed by laser drilling, and most radio-frequency board materials are not suitable for performing laser drilling.

(3) Embedding Design of Power Amplification Module

In such a solution, a PA, a power supply module, and a TRX are designed on the same single board to form a laminated single board. The large PCB may be completely made of a low-cost board material, and may adopt the 1+n+1 laminating mode by using the HDI technology. In this case, a peripheral circuit of the PA is designed on the large PCB, and a matching node and an output portion of the PA adopt an embedding design. In such a solution, as the power amplification tube and the high-power output circuit portion are separately designed as an independent module by using a high-performance radio-frequency board material, and the module is soldered on the large PCB or interconnected to the large PCB by using a suitable connector, and thereby the solution meets the consistency and reliability requirements of the high-frequency PA, and meanwhile meets the requirements of high-power applications. In addition, the solution also achieves the advantages of being favorable for shielding and heat dissipation, and having a simple structure, and a low cost.

However, during the process of implementing the present invention, the inventors found that, in such a solution of the prior art, as the PA adopts an embedded module, a particular connector is required to connect the power amplification module with the large PCB, so that the complexity and cost of the manufacturing and assembling processes are increased. If the module is soldered on the large PCB by reflow soldering, the risks of poor soldering and poor reliability of solder connection may be caused due to the coplanar fitting problems. As the large PCB adopts the HDI technology, the manufacturing cost of the PCB is rather high. In addition, the embedded module is not suitable for the realization of a large-size PA. In addition, as the external shape of the PA module needs to cater to the design requirements of the large PCB, the compatibility of the PA module is deteriorated, resulting in complex material relations, thereby increasing the peripheral costs of assembling, material maintenance, and the like.

All of the above solutions in the prior art have defects. In addition, due to various reasons, in some radio-frequency devices, the demand for a high-power PA (for example, higher than 80 W) is increasingly large. However, the above solutions fail to integrate all the high-power PA, the LNA, the power supply module, the TRX, and other circuits on the same single board, that is because the process of designing the high-power PA and the other modules on the same single board needs to meet requirements in many aspects, including loss, pin count, heat dissipation, single board thickness, partial sintering, warping control, interconnection among single boards and modules, assembling, and the like.

SUMMARY OF THE INVENTION

Accordingly, the present invention is directed to a laminated single board, a manufacturing method thereof, and a radio-frequency device. A fully single board sharing and laminating design is realized for various power modules and other circuit modules, which has a low cost and can meet the requirements of a high-power radio-frequency circuit.

A PCB is provided, which includes a first board material, a second board material, and a third board material sequentially pressed together. The first board material, the second board material, and the third board material are all provided with an opening respectively. At least two openings have different sizes. In a region between boundaries of the two openings having different sizes, at least one borehole is provided to pass through the board material in the region.

A method for manufacturing a PCB is provided, which includes the following steps.

One opening is provided on a first board material, a second board material, and a third board material respectively, in which at least two openings have different sizes.

The first board material, the second board material, and the third board material are sequentially laminated and pressed.

In a region between boundaries of the two openings having different sizes, at least one borehole is provided to pass through the board material in the region.

A radio-frequency device is provided, which includes a PCB and a radio-frequency component mounted on the PCB. The PCB includes a first board material, a second board material, and a third board material that are sequentially pressed together. The first board material, the second board material, and the third board material are all provided with an opening respectively. At least two openings have different sizes. In a region between boundaries of the two openings having different sizes, at least one borehole is provided to pass through the board material in the region.

The PCB, the manufacturing method thereof, and the radio-frequency device in the embodiments of the present invention are highly compatible, and can meet various power and frequency requirements of the radio-frequency device. As a single board solution is adopted, various signal design requirements and PCB layout and wiring requirements can be met. Meanwhile, the PCB cost and the manufacturing cost are quite low, which can meet the requirements of large power amplification.

BRIEF DESCRIPTION OF THE DRAWINGS

To illustrate the technical solutions according to the embodiments of the present invention or in the prior art more clearly, the accompanying drawings required for describing the embodiments or the prior art are introduced below briefly. Apparently, the accompanying drawings in the following descriptions merely show some of the embodiments of the present invention, and persons of ordinary skill in the art can obtain other drawings according to the accompanying drawings without creative efforts.

DETAILED DESCRIPTION OF THE EMBODIMENTS

A detailed description of embodiments of the present invention is given below with reference to the accompanying drawings.

The present invention is described in detail below through some exemplary embodiments with reference to the accompanying drawings.

Figure 1:
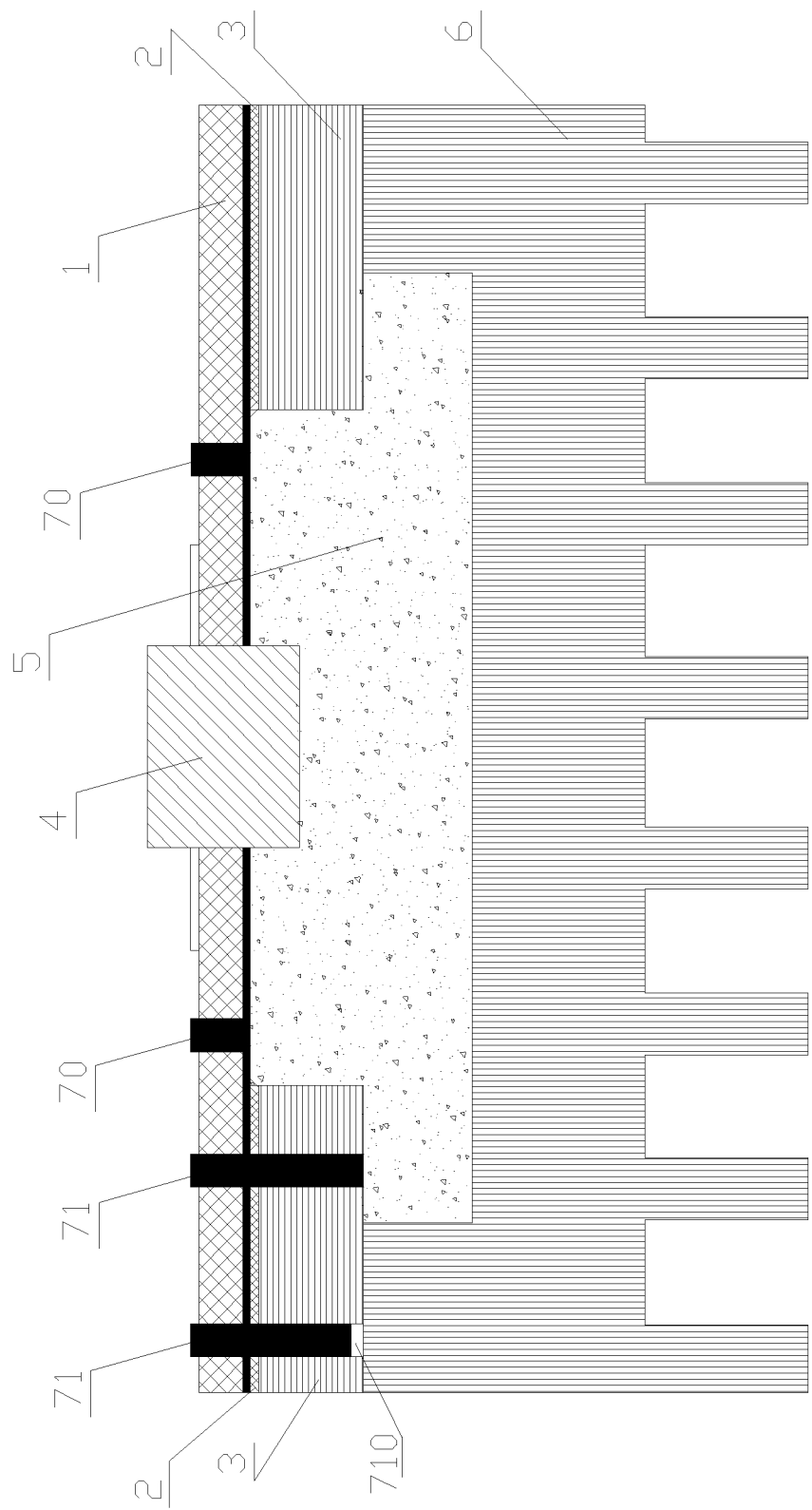
FIG. 1 is a schematic longitudinal sectional view of a PCB according to an embodiment of the present invention.

FIG. 1 is a schematic longitudinal sectional view of a PCB according to an embodiment of the present invention. In this embodiment, for ease of illustration, positions of a partially-sintered heat-dissipation metal block 5 and a heat sink 6 are both shown in the figure. The PCB includes a first board material 1, a second board material 2, and a third board material 3 sequentially pressed together. In a specific implementation, the first board material 1 is a high-frequency PCB material (for example, a radio-frequency board material), the second board material 2 is a prepreg, and the third board material 3 is a low-frequency PCB material. Each board material may be configured in more than one layer. For example, in FIG. 1, the high-frequency PCB material as the first board material is configured in two layers, the prepreg as the second board material is configured in one layer, and the low-frequency PCB material as the third board material is configured in multiple layers. The total layer number N of the laminated single board is determined according to requirements in practical applications. For example, in some applications, N≥4, where N is an even number.

An opening structure of a power amplification tube 4 is provided on the first board material 1, and the second board material 2 and the third board material 3 are provided with an opening respectively, in which a plurality of openings may be provided. At least two openings have different sizes, or corresponding two openings of at least two board materials form a step-shaped region. For example, in FIG. 1, after the three board materials are pressed together, openings at corresponding positions on the second board material 2 and the third board material 3 form a step-shaped opening region, and the step-shaped region is fitted to the partially-sintered heat-dissipation metal block 5. The board material in a region between boundaries of the two openings forming the step-shaped region is provided with a soldering surface on one surface (for example, a bottom surface) thereof close to the larger opening. For example, in a step-shaped region formed by the openings of the first board material 1 and the second board material 2, the first board material 1 in the region between boundaries of the two openings is provided with a soldering surface (i.e., a sintering interface) on a bottom surface thereof, and is configured to solder a corresponding region (for example, a partial region on a top surface) of the partially-sintered heat-dissipation metal block 5. Likewise, a soldering surface is provided on a portion of a region around the opening of the third board material 3, and the step-shaped slot is sintered and fitted to another upper surface of the heat-dissipation metal block 5.

In addition, boreholes passing through at least one board material are provided on the PCB. In some embodiments, the boreholes may be provided in a region between boundaries of at least two openings (for example, the two openings having different sizes), for example, a borehole 70 passing through the first board material 1 is provided in a region between boundaries of the openings of the first board material 1 and the second board material 2. Alternatively, boreholes passing through the three board materials may be further provided in a region outside the largest opening, for example, a borehole 71 passing through the first board material 1, the second board material 2, and the third board material 3. The borehole 70 and the borehole 71 are both plated through holes. Optionally, a part of the boreholes are selectively back-drilled, i.e., a part of the boreholes or the boreholes in a partial region are selected and then back-drilled, and then, a bonding pad and a wall on a certain side of the borehole are removed by drilling to form a back-drilled hole or a back-drilled groove. For example, a non-ground borehole may be back-drilled, so that a wall of the borehole is separated from the other electrically-conductive materials. For example, as shown in the figure, the borehole 71 is back-drilled to foam a back-drilled hole 710, so that the wall of the borehole 71 is separated from the heat sink 6 therebelow, thereby avoiding generating the electrical connection there-between, and meanwhile achieving functions of improving the heat-dissipation effect.

Figure 2:
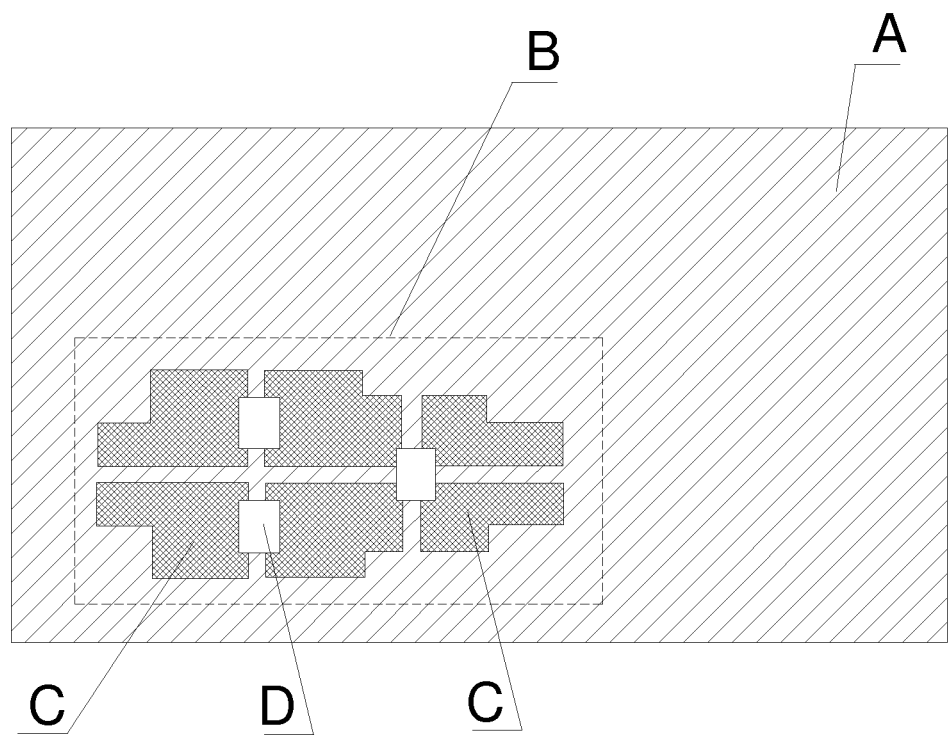
FIG. 2 is a top view of a PCB according to an embodiment of the present invention.
Figure 3:
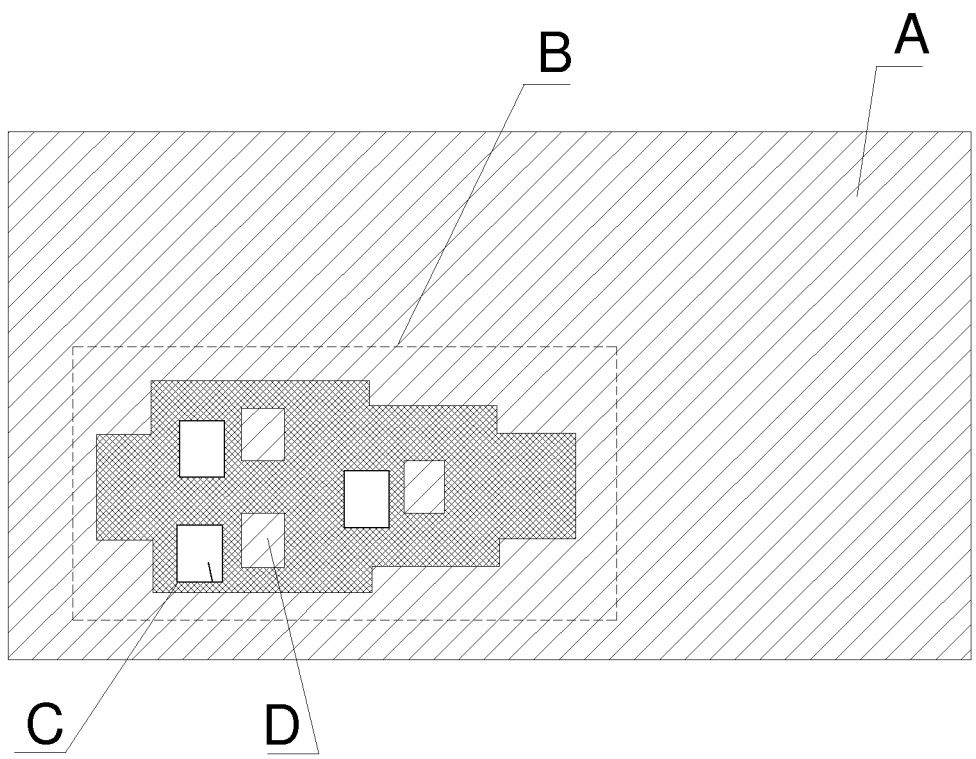
FIG. 3 is a top view of a PCB according to another embodiment of the present invention.

FIG. 2 is a top view of a laminated single board according to an embodiment of the present invention. Referring to FIG. 2, a schematic plan view of a finished laminated single board (PCB) without any component assembled thereon is shown. Meanwhile, reference may also be made to another embodiment shown in FIG. 3.

Region A is a region of the entire laminated PCB with all layers (for example, N layers), and the boreholes in the region are mechanical plated through holes of the 1 to N layers.

Regions C are step-shaped opening regions. Six independent step-shaped opening regions are shown in FIG. 2. In other embodiments, several independent step-shaped openings may also be combined into a large step-shaped opening (referring to FIG. 3), and the boreholes in the regions are mechanical plated through holes of the first board material (for example, 1 to 2 layers). In addition, the regions may be considered as sintered interfaces formed when the partially-sintered heat-dissipation metal block contacts the step-shaped openings of the PCB.

Region D is an opening region of a power amplification tube.

A dashed-line frame B represents a two-dimensional shape of the partially-sintered heat-dissipation metal block behind the power amplification region. No matter how many small step-shaped openings are provided, one metal block is provided, and a lower surface of the metal block is a plane, and an upper surface of the metal block is a step-shaped surface, so as to respectively cater to a lower surface of the power amplification flange, and a bottom surface of the second board material and an $n^{th}$ layer bottom surface of the third board material of the PCB in the step-shaped opening region. Therefore, the step-shaped surfaces with at least three different heights are formed on the upper surface of the partially-sintered heat-dissipation metal block.

In this embodiment, region C and region D are real sintered surfaces of the partially-sintered heat-dissipation metal block; and the other regions do not need to be sintered, but the sintered heat-dissipation metal block, the laminated PCB, and the heat sink may be fastened in the other regions by using, for example, screws.

The structure of the laminated PCB of the present invention has been introduced in the above descriptions. In practical applications, radio-frequency components are mounted on the laminated PCB to form a radio-frequency device (for example, a base station). For example, corresponding radio-frequency components may be attached to a front surface and/or a back surface of the laminated PCB. A power amplification tube is sintered at the opening of the first board material on the front surface of the laminated PCB, and a metal block is sintered and a heat sink is mounted at the step-shaped surfaces of the second board material and the third board material on the back surface of the laminated PCB. In an embodiment, the radio-frequency components include a high-power radio-frequency PA, an LNA, a TRX, a power supply circuit component, and the like. The TRX may further include a receiving circuit, a transmitting circuit, a feedback processing circuit, a digital-to-analog conversion circuit, a baseband processing circuit, and the like.

Figure 4:
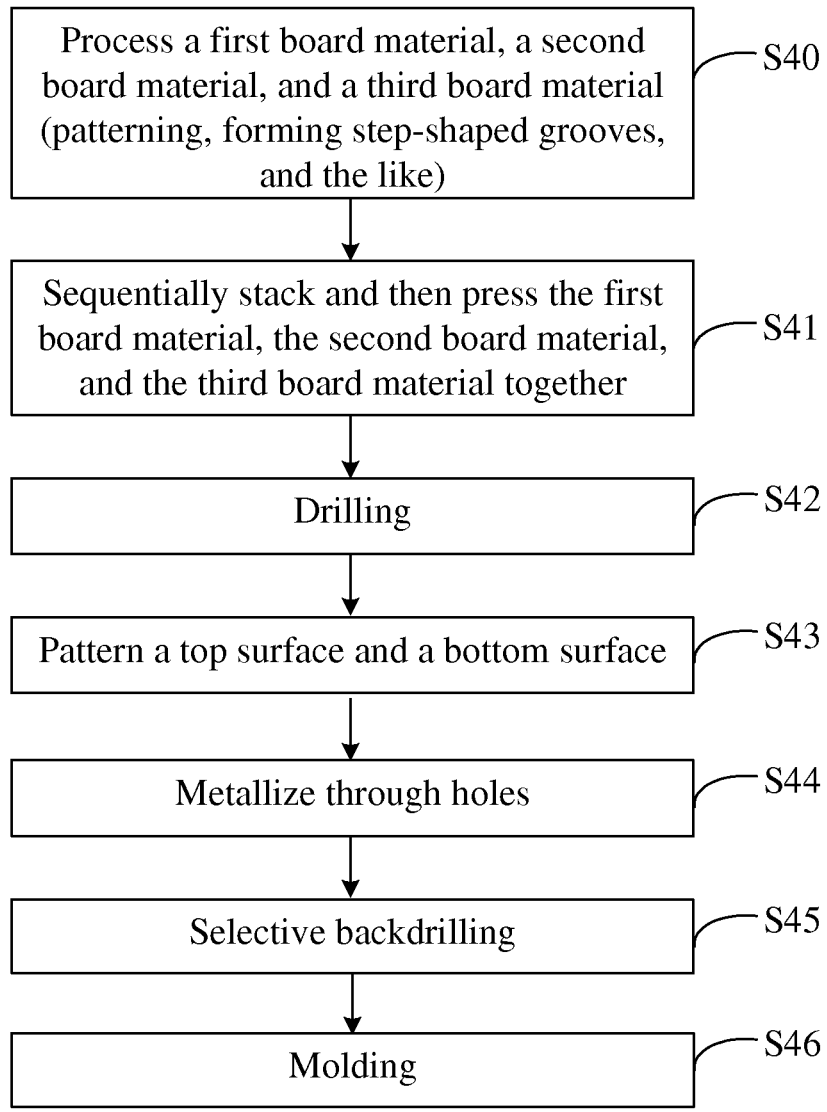
FIG. 4 is a schematic flow chart of a method for manufacturing a PCB according to an embodiment of the present invention.

FIG. 4 is a schematic flow chart of a method for manufacturing a PCB according to an embodiment of the present invention. Referring to FIG. 4, the method includes the following steps.

In step S40, a first board material is processed. For example, a first layer and a second layer are both made of a first radio-frequency board material, and the second layer is patterned. At this time, no drilling and metallization processes are performed.

A second board material is processed. For example, an opening is provided in a second prepreg.

A third board material is processed. For example, a third layer to an $N^{th}$ layer are, for example, made of a third ordinary low-cost board material, in which a (N−2) layer board is manufactured first, and then an opening is provided on the board. At this time, no drilling and metallization processes are performed.

In step S41, the processed first board material, second board material, and third board material are sequentially stacked from top to bottom, and then pressed together.

In step S42, the pressed PCB is placed on a table of a driller in such a manner that an $N^{th}$ layer surface thereof faces downwards, and then through holes are formed in region C and/or region A by mechanical drilling.

In step S43, a top surface and a bottom surface of the laminated PCB are patterned according to circuit design requirements.

In step S44, a metallization process is performed on the through holes formed in step S42.

In step S45, back surfaces of non-ground holes as the through holes are selectively back-drilled according to the requirements.

In step S46, a molding process is performed, including forming an opening of a power amplification flange.

Step S45 is optional.

Thus, the process of manufacturing a laminated PCB bare board (without any circuit component being assembled thereon) is completed.

Figure 5:
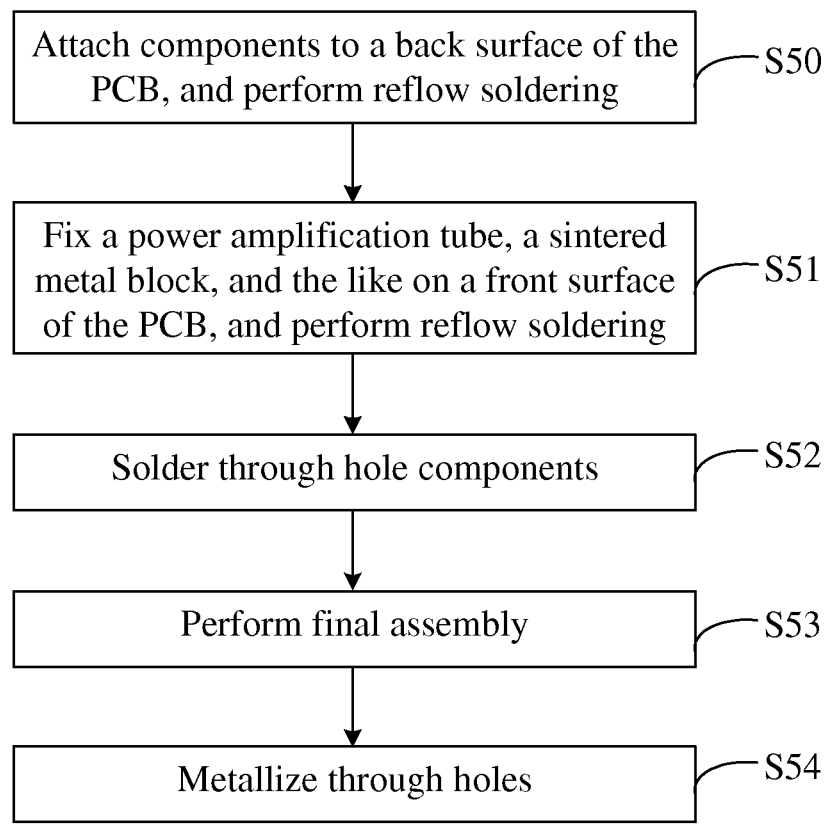
FIG. 5 is a schematic flow chart of a component assembling process in a method for manufacturing a PCB according to an embodiment of the present invention.

Then, a flow of assembling components on the laminated PCB bare board is described below. As shown in FIG. 5, the flow includes the following steps.

In step S51, if components need to be attached to the back surface of the laminated PCB, the backside components are attached first, and then reflow soldering is performed.

In step S52, components to be attached to the front surface (main component surface) of the laminated PCB are then mounted, which further includes: placing surface-mounting components of a power amplification tube at corresponding openings, pressing a sintered metal block coated with a soldering tin to the step-shaped back surface of the PCB from the lower side, fixing the PCB with the sintered metal block by using a prepared clamp, and then performing reflow soldering.

If no component needs to be attached to the back surface of the PCB, step S51 may be omitted.

In step S53, plug-in components are soldered. Hand soldering or partial wave soldering may be adopted. Alternatively, the reflow soldering may be performed on the plug-in components in the foregoing steps.

In step S54, final assembly is performed. The PCBA including the sintered metal block is considered as a whole to be assembled with the other parts (for example, a heat sink), and no hand soldering is required in the subsequent operations. The subsequent final assembly process is the same as the assembly process of ordinary electronic equipments, so the details are not descried herein again.

To sum up, the PCB, the manufacturing method thereof, and the radio-frequency device provided in the embodiments of the present invention have the following advantages.

As board materials of different types are laminated in the PCB, the cost is further reduced. The present invention can fully meet the requirements for realizing the PA (for example, meeting the heat-dissipation requirements, achieving the reflow of a matching node, and preventing the board materials from being deformed or becoming soft under a high temperature). The present invention is applicable to high-power or high-frequency applications. The present invention is applicable to a large-size PA.

The manufacturing process of the laminated PCB is quite simple. In the whole process, only a few drilling operations (for example, only once) are performed, and no special PCB technologies such as HDI technology or buried holes or blind holes are required, so that the manufacturing cost is low.

As only one sintered metal block is used, the heat dissipation is facilitated, and the number of planar structures is reduced. The combination of a plurality of small step-shaped openings solves the problems such as the slumping of the PCB during the PCB manufacturing process and the deformation of the PCB due to the load during the assembling process. Moreover, the heat sink may also function as a shielding cap.

By using the selective back-drilling, when the PCB adopts a single-sided layout, the heat sink structure can be simplified, and the heat-dissipation and shielding performances can be improved.

Therefore, the laminated PCB and the corresponding radio-frequency device of the present invention effectively solves the problem about a fully single board sharing design in high-power or high-frequency power amplification application scenarios, meets various signal design requirements and other design requirements including heat dissipation, shielding, PCB manufacturing, and assembling, and is highly applicable and has a lower cost.

Through the above descriptions of the embodiments, it is apparent to those skilled in the art that, the present invention may be accomplished by software in combination with a necessary universal hardware platform, and definitely may also be accomplished by hardware. Therefore, the technical solution of the present invention or the part that makes contributions to the prior art can be substantially embodied in the form of a software product. The computer software product is stored in a storage medium, and contains several instructions to instruct computer equipment (for example, a personal computer, a server, or network equipment) to perform the method as described in the embodiments of the present invention.

The above descriptions are merely some exemplary embodiments of the present invention, but not intended to limit the scope of the present invention. Any equivalent variation made according to the claims of the present invention shall fall within the scope of the present invention.

The invention claimed is:

1. A Printed Circuit Board (PCB), comprising: a first board material, a second board material, and a third board material sequentially pressed together, wherein the first board material, the second board material, and the third board material are provided with an opening respectively; at least two of the openings have different sizes, wherein, the openings are used for accommodating a heat-dissipation metal block, a surface of the heat-dissipation metal block is solder with a soldering surface of at least one of the first board material, the second board material, and the third board material, wherein, in the first board material the second board material and the third board material, corresponding two openings of at least two of the first board material the second board material and the third board material form a step-shaped region, and the board material in a region between boundaries of the two openings forming the step-shaped region is provided with a soldering surface on one surface thereof close to a larger opening of the two openings and the soldering surface is configured to solder a corresponding region of a partially-sintered heat-dissipation metal block, wherein, the first board material is a high-frequency PCB material, the second board material is a prepreg, and the third board material is a low-frequency PCB material, and each of the first board material, the second board material and the third board material comprises at least one layer.

2. The PCB according to claim 1, wherein, a borehole passing through the three board materials is further provided in a region outside the largest opening.

3. The PCB according to claim 1, wherein, at least one borehole is provided with a back-drilled hole or a back-drilled groove.

4. A method for manufacturing a Printed Circuit Board (PCB), comprising: forming an opening in each of a first board material, a second board material, and a third board material respectively, at least two of the openings have different sizes; wherein the openings are used for accommodating a heat-dissipation metal block, a surface of the heat-dissipation metal block is solder with a soldering surface of at least one of the first board material, the second board material, and the third board material; stacking the first board material, the second board material, and the third board material are-sequentially; and pressing the stacked first board material, second board material, and third board material together; and wherein after stacking and pressing, in the first board material the second board material and the third board material corresponding two openings of at least two of the first board material the second board material, and the third board material form a step-shaped region; and the board material in a region between boundaries of the two openings forming the step-shaped region is provided with a soldering surface on one surface thereof close to a larger opening of the two openings and the soldering surface is configured to solder a corresponding region of a partially-sintered heat-dissipation metal block, wherein, the first board material is a high-frequency PCB material, the second board material is a prepreg, and the third board material is a low-frequency PCB material, and each of the first board material, the second board material and the third board material comprises at least one layer.

5. The method according to claim 4, wherein, the method further comprises:
forming a borehole which is in a region outside the largest opening and passes through the three board materials.

6. The method according to claim 4, wherein, the method further comprises:
back-drilling on a part chosen from a borehole which has been metallized in the pressed board material from backside.

7. The method according to claim 5, wherein, the method further comprises:
mounting a radio-frequency component or a heat sink on the pressed board material.

8. The method according to claim 7, wherein, the step of mounting a radio-frequency component or a heat sink on the pressed board material comprises:
soldering a component on the back surface and/or the front surface of the laminated PCB;
fixing a heat-dissipation metal block with the opening by mounting and sintering the heat-dissipation metal block to the opening; and
mounting the heat sink on the heat-dissipation metal block.

9. A radio-frequency device, comprising: a Printed Circuit Board (PCB) and a radio-frequency component mounted on the PCB, wherein the PCB comprises a first board material, a second board material, and a third board material sequentially pressed together; the first board material, the second board material, and the third board material are provided with an opening respectively; and at least two of the openings have different sizes, wherein the openings are used for accommodating a heat-dissipation metal block, a surface of the heat-dissipation metal block is solder with a soldering surface of at least one of the first board material, the second board material, and the third board material, wherein in the first board material the second board material, and the third board material, corresponding two openings of at least two of the first board material the second board material, and the third board material form a step-shaped region, and the board material in a region between boundaries of the two openings forming the step-shaped region is provided with a soldering surface on one surface thereof close to a larger opening of the two openings and the soldering surface is configured to solder a corresponding region of a partially-sintered heat-dissipation metal block, wherein, the first board material is a high-frequency PCB material, the second board material is a prepreg, and the third board material is a low-frequency PCB material, and each of the first board material, the second board material and the third board material comprises at least one layer.

10. The radio-frequency device according to claim 9, wherein, a borehole passing through the three board materials is further provided in a region outside the largest opening.

11. The radio-frequency device according to claim 9, wherein, at least one borehole is provided with a back-drilled hole or a back-drilled groove.

12. The radio-frequency device according to claim 9, wherein, the radio-frequency device is a base station and the radio-frequency component is one of a high-power radio-frequency PA low noise amplifier or a transceiver and a power supply circuit component.

* * * * *

UNITED STATES PATENT AND TRADEMARK OFFICE
CERTIFICATE OF CORRECTION

| | | |
|---|---|---|
| PATENT NO. | : 8,633,393 B2 | Page 1 of 1 |
| APPLICATION NO. | : 12/789247 | |
| DATED | : January 21, 2014 | |
| INVENTOR(S) | : Yang et al. | |

It is certified that error appears in the above-identified patent and that said Letters Patent is hereby corrected as shown below:

In the Claims

Column 8, Claim 4, line 52 "the third board material are-sequentially" should read --the third board material sequentially--.

Signed and Sealed this
Thirteenth Day of May, 2014

Michelle K. Lee
*Deputy Director of the United States Patent and Trademark Office*